United States Patent
Lo et al.

(10) Patent No.: US 9,711,420 B1
(45) Date of Patent: Jul. 18, 2017

(54) INLINE FOCUS MONITORING

(71) Applicant: Taiwan Semiconductor Manufacturing Co., Ltd., Hsin-Chu (TW)

(72) Inventors: Yuan-Yen Lo, Taipei (TW); Chia-Chu Liu, Shin-Chu (TW); Ming-Jhih Kuo, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/069,608

(22) Filed: Mar. 14, 2016

(51) Int. Cl.
- *G03F 1/00* (2012.01)
- *G03F 7/20* (2006.01)
- *G03C 5/00* (2006.01)
- *H01L 21/66* (2006.01)

(52) U.S. Cl.
CPC ............ *H01L 22/20* (2013.01); *H01L 22/12* (2013.01); *H01L 22/34* (2013.01)

(58) Field of Classification Search
CPC ......... H01L 22/20; H01L 22/12; H01L 22/34; G03F 9/7026; G03F 1/00; G01N 21/956
USPC ........ 355/53, 55, 77; 430/5, 30, 311; 257/48
See application file for complete search history.

(56) References Cited

U.S. PATENT DOCUMENTS

| | | | | |
|---|---|---|---|---|
| 6,414,326 B1 * | 7/2002 | Nguyen | ............... | G03F 7/70558 250/492.2 |
| 6,500,591 B1 * | 12/2002 | Adams | ................ | G03F 7/70241 430/30 |
| 6,673,638 B1 * | 1/2004 | Bendik | ............... | G03F 7/70625 430/30 |
| 8,052,908 B2 * | 11/2011 | Peckerar | ................... | G03F 1/54 264/219 |
| 8,703,369 B2 * | 4/2014 | Spaziani | ............... | G03F 7/2037 356/636 |
| 8,716,841 B1 | 5/2014 | Chang et al. | | |
| 8,736,084 B2 | 5/2014 | Cheng et al. | | |
| 8,837,810 B2 | 9/2014 | Chen et al. | | |
| 2006/0234137 A1 * | 10/2006 | Kim | .......................... | G03F 1/26 430/5 |
| 2008/0297752 A1 * | 12/2008 | Wang | ........................ | G03F 1/32 355/55 |
| 2012/0308112 A1 | 12/2012 | Hu et al. | | |
| 2013/0201461 A1 | 8/2013 | Huang et al. | | |
| 2014/0101624 A1 | 4/2014 | Wu et al. | | |
| 2014/0111779 A1 | 4/2014 | Chen et al. | | |
| 2014/0119638 A1 | 5/2014 | Chang et al. | | |
| 2014/0123084 A1 | 5/2014 | Tang et al. | | |
| 2014/0226893 A1 | 8/2014 | Lo et al. | | |
| 2014/0253901 A1 | 9/2014 | Zhou et al. | | |
| 2014/0256067 A1 | 9/2014 | Cheng et al. | | |
| 2014/0257761 A1 | 9/2014 | Zhou et al. | | |

* cited by examiner

*Primary Examiner* — Dao H Nguyen
(74) *Attorney, Agent, or Firm* — Haynes and Boone, LLP

(57) ABSTRACT

A method includes processing a first silicon wafer using a first focus condition, the first silicon wafer comprising: a first test pattern and a second test pattern, the first test pattern and the second test pattern being different. The method further includes determining a first critical dimension for the first test pattern, determining a second critical dimension for the second test pattern, determining a delta focus value based on the first critical dimension and the second critical dimension, and processing a second silicon wafer with a second focus condition, the second focus condition based on the delta focus value.

20 Claims, 6 Drawing Sheets

INLINE FOCUS MONITORING

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A common process used for fabricating integrated circuits is photolithography. Photolithography involves exposing a photoresist layer to a light source through use of a mask. Two important conditions to consider when performing a photolithography process are the focus and the exposure. Different patterns may require different levels of focus and exposure in order to achieve the appropriate critical dimension. Thus, it is desirable to determine the proper focus and exposure for that pattern for use in the production line. Additionally, the focus may shift over time during production of a particular pattern. Thus, it is desirable to correct the focus if needed. It is also desirable to monitor the focus in an efficient manner that reduces downtime.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
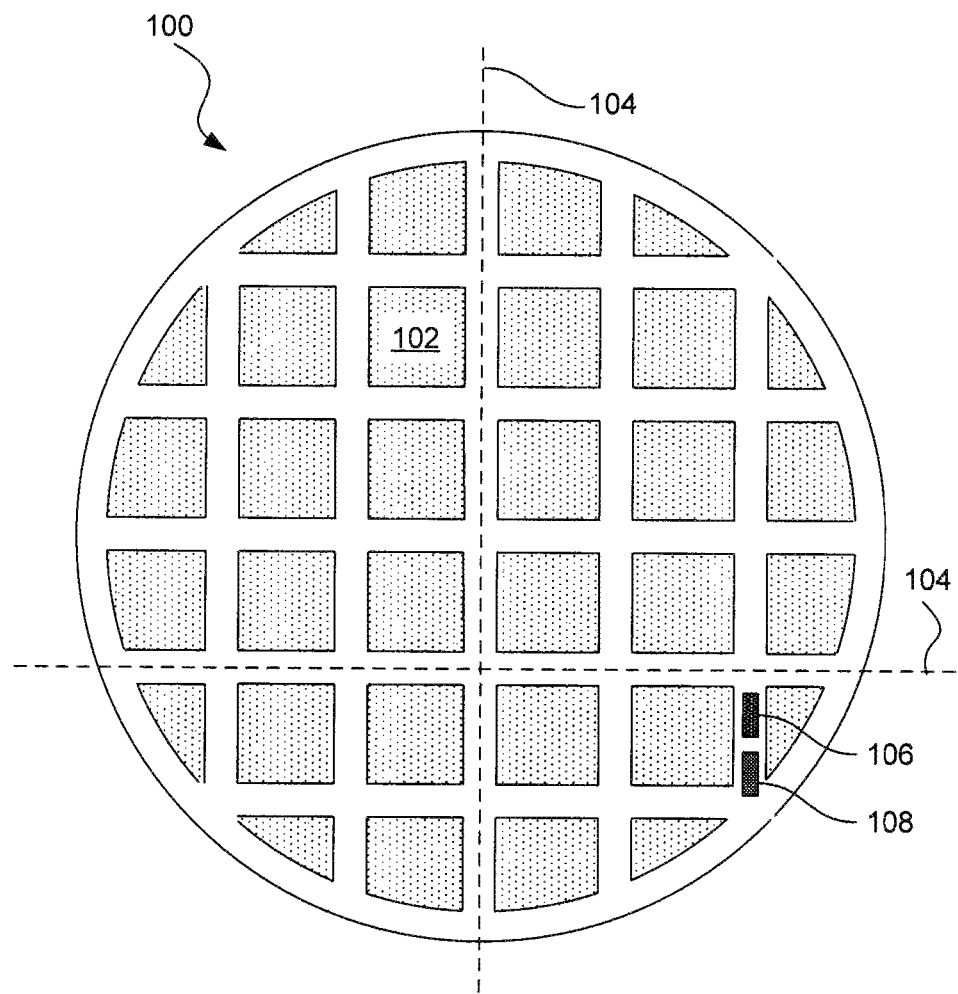
FIG. 1 is a diagram showing an illustrative top view of a production wafer that includes two test patterns used for monitoring focus, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in, which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to determine the proper focus and exposure conditions for a pattern an efficient manner that reduces downtime. The focus condition refers to the distance between the substrate and the mask used to expose the substrate to a light source. The exposure condition refers to the energy level of the light source that is used to expose the substrate. Conventionally, for a particular pattern, a test wafer is processed to create a focus exposure matrix (FEM). The FEM generally includes a grid with one dimension representing different exposure values and the other dimension representing different focus values. Each grid location thus includes a test pattern that is exposed with unique combination of focus and exposure values. After exposing the test wafer under the various focus and exposure conditions, the test wafer is then developed. Then, the critical dimension for the test patterns within each grid location is determined. The critical dimension refers to the smallest size of a feature within a pattern. Using the data collected from the FEM matrix of the test wafer, the ideal focus and exposure conditions can be determined for the desired critical dimension for a particular pattern that is to be used for production.

The test wafer may be a specially designed to test wafer with test patterns that are designed for use with the FEM matrix. In such a case, the test wafer may be discarded after use. In some examples, an actual production wafer may be used as a test wafer for the FEM matrix. In such a case, however, after the data is collected from the FEM matrix, the production wafer has to be reworked. In other words, the photoresist has to be removed and the wafer has to be prepared for the correct photoresist pattern to be formed. In either case, obtaining the data from the FE M matrix is time-consuming and results in loss of production time. It is desirable to reduce this loss of production time to increase production efficiency. According to principles described herein, focus monitoring can be achieved without creating an FEM matrix.

Specifically, according to one example of principles described herein, two different test patterns are formed within a test region of the production wafer. The test region may be along the scribe lines between different die of the production wafer. The two test patterns have similar focus sensitivities yet have similar optimal focus conditions. In other words, the critical dimension as a function of focus is different. More specifically, the two test patterns have Bossung curves that have a substantially linear difference. A Bossung curve can be used to represent the critical dimension of a particular pattern as a function of focus. Thus, the Bossung curve of a first test pattern minus the Bossung curve of a second test pattern is substantially linear.

To use such test patterns for inline focus monitoring, the first production wafer of a production run is processed using a predetermined set of focus conditions without the use of an FEM. The predetermined conditions may be based on historical data related to the production patterns and other factors. After developing the pattern, the critical dimension for both the first test pattern and the second test pattern are measured. The difference of those two critical dimension values can be used to determine a delta focus value. The delta focus value indicates the change in focus that should be made to change the focus conditions to the optimal level. If the delta focus value is within a predefined tolerance range, then the wafer of the first production run does not have to be reworked. Thus, the next wafer can be processed using an updated focus value based on the delta focus value. If, however, the delta focus value is outside the predefined tolerance range, then the wafer of the first production run may be reworked. Using principles described herein, the first wafer of each production run may not have to be reworked each time. Additionally, the inline focus monitoring using the test patterns may be performed periodically to determine if there has been a shift in focus. Thus, the focus can be monitored inline.

FIG. 1 is a diagram showing an illustrative top view of a production wafer 100 that includes two test patterns 106, 108 used for monitoring focus. While FIG. 1 illustrates only one set of the test patterns 16, 108, it may be the case that multiple copies of the test patterns 106, 108 are formed throughout the production wafer 100. A production wafer 100 typically includes multiple dies 102. Each die may have a number of production patterns formed thereon. Production patterns are the patterns used to create functioning circuitry of an integrated circuit. Each die typically includes a standalone circuit. After processing of the production wafer is complete, each die is cut out along scribe lines 104, In some examples, each die is a copy of the same circuit. In some examples, however, different die may have different circuit designs formed thereon.

Because the wafer is cut along scribe lines 104, the space along the scribe lines may be used for placing test patterns 106, 108 without sacrificing wafer space that is used for circuitry. Thus, the amount of surface area available for fabrication of actual circuitry is not affected. In other words, multiple test patterns 106,108 may be placed along any of the scribe lines without having to redesign the actual circuitry within each die to make space for placement test patterns 106, 108.

The test patterns 106, 108 are designed to have specific characteristics that allow for inline focus monitoring. Specifically, the patterns are designed such that there is a specific type of relationship between their respective Bossung curves. In some examples, a Bossung curve is a representation of critical dimension as a function of focus. The test patterns 106, 108 are designed such that they have Bossung curves that have a substantially linear difference. In other words, the difference between the Bossung, curve for test patter 106 and the Bossung curve for test pattern 108 is substantially linear.

Figure 2:
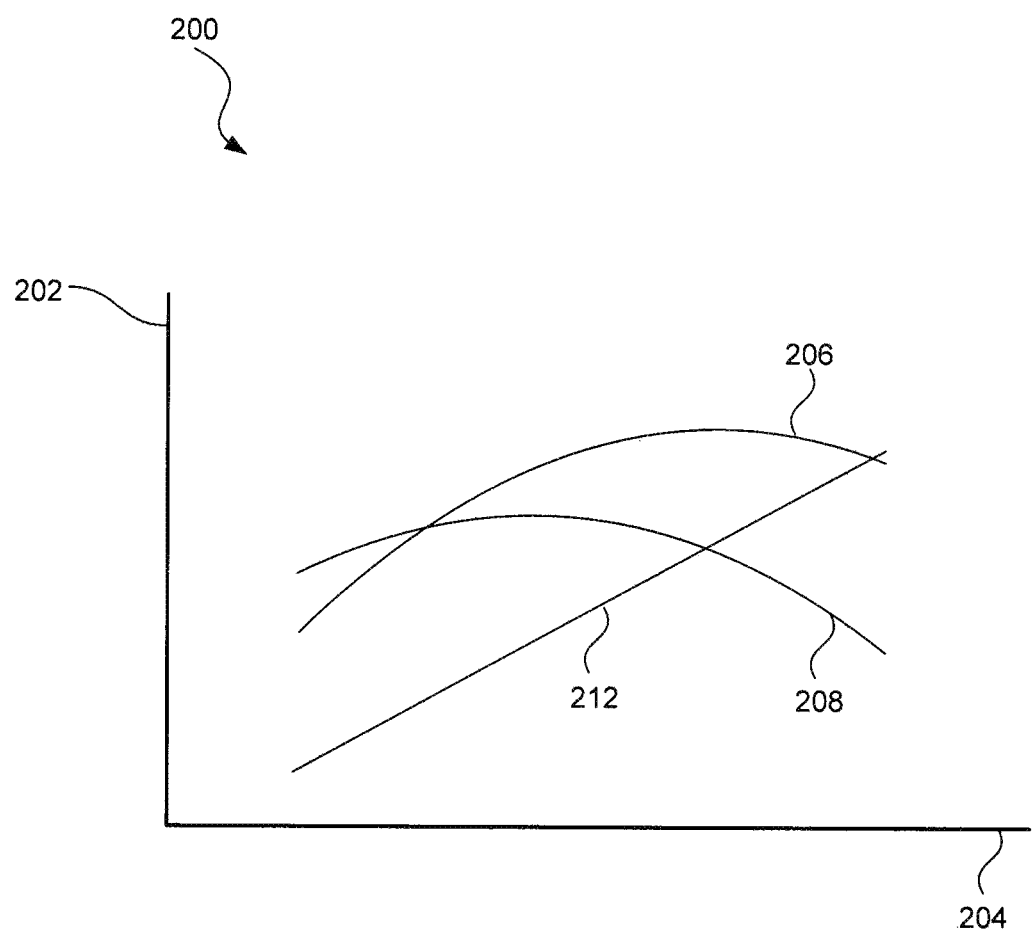
FIG. 2 is a graph showing Bossung curves for different test patterns, according to one example of principles described herein.

FIG. 2 is a graph showing Bossung curves for different test patterns. According to the present example, the vertical axis 202 represents critical dimension and the horizontal axis 208 represents focus. The first Bossung curve 206 corresponds to the first test pattern 106. The second Bossung curve 208 corresponds to the second test pattern 108. Line 212 represents the difference between, the first Bossung curve 206 and the second Bossung curve 208. As illustrated, the difference between the two Bossung curves 206, 208 is substantially linear.

One way to represent a Bossung curve is through polynomial representation. For example a Bossung curve may be represented as: $y=ax^2+bx+c$, where y critical dimension; x=focus value; and a, b, and c are coefficients. For purposes of discussion, the a value will be referred to as the first coefficient, the b value will be referred to as the second coefficient, and the c value will be referred to as the third coefficient. Bossung curve 206 may be represented as $y_1=a_1x^2+b_1x+c_1$ and Bossung curve 208 may be represented as $y_2=a_2x^2+b_2x+c_2$. The difference equation between the two Bossung curves is thus: $\Delta y=(a_1-a_2)x^2+(b_1-b_2)x+(c_1-c_2)$. If the test patterns 106, 108 are designed such that $a_1$ and $a_2$ are substantially similar, then the first coefficient of the difference equation becomes negligible. In such a case, the difference equation essentially becomes: $\Delta y=(b_1-b_2)x+(c_1-c_2)$, which is a linear equation.

Thus, by designing the test patterns 106, 108 such that the first coefficients of their respective Bossung curves are substantially similar, a linear relationship in the difference between the two Bossung curves can be achieved. Additionally, to provide better sensitivity, it is desirable the second coefficients (i.e., $b_1$ and $b_2$) are substantially different. A greater difference between the second coefficients results in a steeper slope of the difference 212 between the two Bossung curves 208, 210. A steeper slope means that for a larger change in critical dimension, there is a smaller change in focus. This can allow for more precise focus monitoring.

In some examples, the test patterns can be designed such that the difference curve 212 has a certain degree of linearity. That linearity may be defined as the absolute value of the second coefficient divided by the first coefficient is greater than 50. Other tolerance levels for the degree of linearity may be used as well.

The Bossung curves for the various test patterns 106, 108 may be determined before production of a particular pattern. The test patterns 106, 108 may undergo a variety of testing and vetting processes to find the ideal test patterns that have the characteristics described above. After the test patterns 106, 108 have been defined, the two different test patterns 106, 108 may be formed into a mask used for a production wafer. Thus, when the production wafer is formed, the test patterns 106, 108 will be formed as well.

Figure 3:
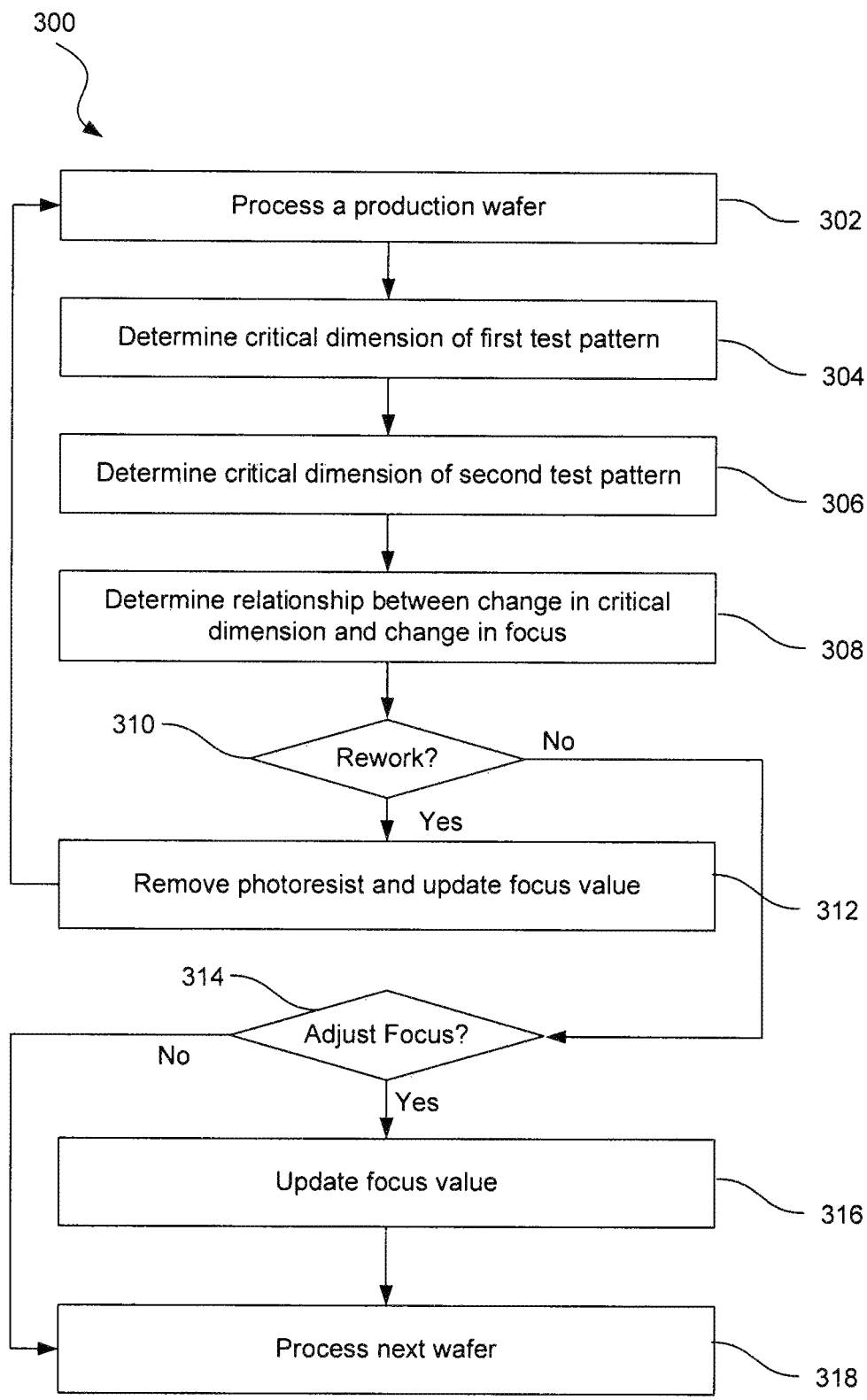
FIG. 3 is a flowchart showing illustrative method for monitoring focus, according to one example of principles described herein.

FIG. 3 is a flowchart showing illustrative method 300 for monitoring focus. According to the present example, the method 300 includes a step 302 for processing a production wafer. Processing the production wafer includes depositing a photoresist layer on the wafer. Then, the photoresist layer is exposed to a light source through use of a mask. The mask includes a number of features that are used to form patterns into the photoresist layer. These patterns are used to form features that become part of the circuitry being formed within the wafer. In addition to the mask features used to create actual circuitry, the mask includes features that form test patterns. For example, the mask may include test patterns 106 and 108 as described above. Such test patterns 106, 108 will then be transferred to the photoresist layer during the exposure process. After exposure, the wafer is developed to remove portions of the photoresist that are soluble to the developing solution.

The first processing of a production wafer will be referred to as the pilot run. As described above, conventional methods use an FEM wafer for the pilot run to find the optimal focus and exposure conditions. But, according to principles described herein, to avoid use of the FEM wafer, the first production wafer is processed using a predetermined set of focus and exposure conditions for the production pattern. The predetermined set of focus and exposure conditions may be based on historical data for the production pattern (if available) or historical data for similar patterns. The predetermined focus and exposure conditions may also account for other factors known by design engineers that may have an effect on the focus and exposure conditions to achieve the desired critical dimension for the production pattern. As will be described in further detail below, if the predetermined focus conditions do not produce the desired critical dimension, then the first production wafer may be reworked. If, however, the predetermined focus conditions are accurate enough, then the wafer does not have to be reworked. This provides an advantage over conventional methods because in conventional methods the pilot run has to be reworked every time. Using principles described herein, the pilot run is only reworked in cases where the critical dimension of the pilot run is outside of a target critical dimension.

After the photoresist layer has been developed, the method 300 includes a step 304 for determining the critical dimension of the first test pattern. The method 300 also includes a step 306 for determining the critical dimension of the second pattern. As described above, the critical dimension, refers to the smallest feature size within a particular pattern. Various tools can be used to measure the critical dimension of test patterns. For example, a Scanning Electron Microscope (SEM) may be used to determine the critical dimension of the test patterns.

At step 308 the difference in critical dimension is used to determine the change in focus based on the difference equation described above. Specifically, knowing the value for $\Delta y$, the equation $\Delta y=(b_1-b_2)x+(c_1-c_2)$ can be solved for x. As described above, the x value indicates the shift in focus for a particular change in critical dimension. For example, it may be determined that a 1 nanometer change in critical dimension corresponds to a 10 nanometer change in focus.

Additionally, at step 310, it is determined whether the recently processed production wafer should be reworked. The recently processed production wafer may be reworked if it is determined that the difference between the critical dimension of the first test pattern and the critical dimension of the second pattern is above a threshold level. Or, the recently processed production wafer may be reworked if the delta focus value, as determined from the difference equation, is above a predetermined threshold value. If the focus conditions for processing the production wafer are optimal, then the difference between the critical dimension of the first test pattern in the critical dimension of the second test pattern will be substantially zero. In other words, the farther the focus value is from the optimal focus condition, the greater the critical dimension difference between the first test pattern and second test pattern will be.

If it is determined that the production wafer is to be reworked, then the method proceeds to step 312 at which the photoresist is removed and the focus value is updated. Reworking the production wafer involves stripping the remaining photoresist, cleaning the production wafer, and reapplying a new photoresist layer. Then, the production wafer is processed using the updated focus value. The updated focus value may be determined using the equation described above. Specifically, the equation provides a relationship between change in critical dimension and change in focus. For example, if it is determined that there is a 2 nanometer change in critical dimension between the critical dimension of the first test pattern and the critical dimension of the second test pattern, then a shift of 20 nanometers in focus may be used (using the example above in which 1 nanometer change in critical dimension corresponds to a 10 nanometer change in focus). Using this information, the production wafer is reworked using the revised focus value. After reworking the production wafer with the revised focus value, it can be expected that the difference between the critical dimension of the first test pattern and the critical dimension of the second test pattern will be substantially zero. The method 300 then returns to step 302 at which the production wafer is processed using the updated focus value.

If, however, it is determined that the production wafer does not have to be reworked, then the method proceeds to step 314, at which it is determined whether the focus condition should be updated. In some examples, there may be some difference between the critical dimension of the first test pattern in the critical dimension of the second test pattern while that difference is still below the predefined level. Thus, the wafer does not have to be reworked, but it may be desirable to update the focus value for the next production wafer. Thus, the method 300 proceeds to step 316 at which the focus value is updated. For example, it may be determined that the difference between, the critical dimension of the first test pattern and the critical dimension of the second test pattern is 0.5 nanometers. Using the example described above, the focus value may be shifted by 5 nanometers for the next production wafer. The method then proceeds to step 318 at which the next production wafer is processed.

If, however, it is determined at step 314 that no adjustment of the focus value should be made, then the method 300 proceeds directly to step 318 at which the next production wafer is processed. For each production wafer that is processed after the pilot run, the updated focus value may be used. Periodically, it may be desirable to monitor the focus to determine whether another update may be beneficial. For example, an additional inline focus check may be performed for every 100 production wafers processed. Other numbers are contemplated as well. The in-line focus check may involve measuring the difference between, the critical dimension of the first test pattern in the critical dimension of the second test pattern. If the difference is substantial, then the focus value may be updated accordingly. In some examples, the in-line focus check may be performed at periodic time intervals instead of periodic production runs. For example, the in-line focus check may be performed every week. Other time intervals are contemplated as well.

Figure 4A:
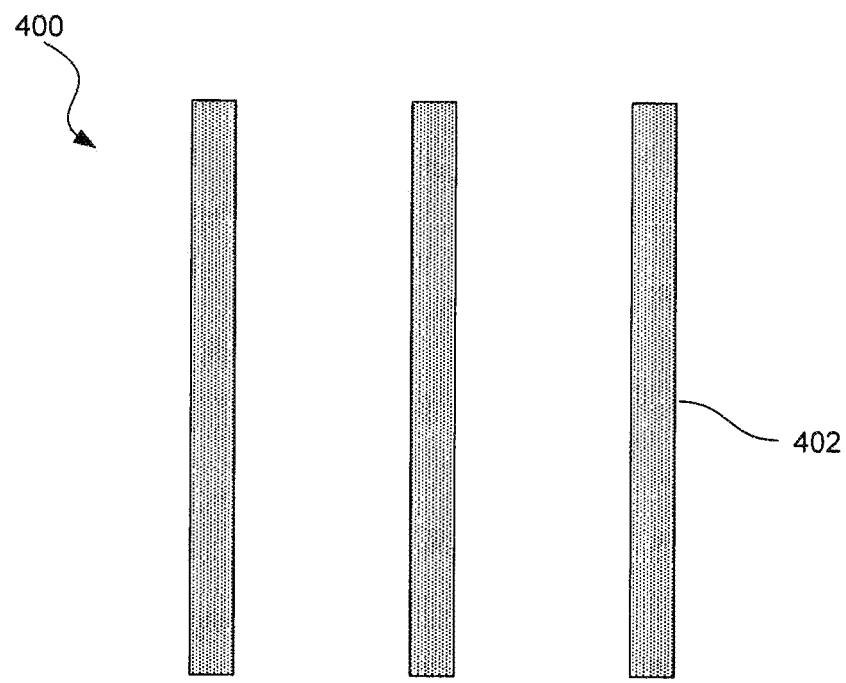
FIGS. 4A and 4B are diagrams showing illustrative test patterns that are used for monitoring focus, according to one example of principles described herein.
Figure 4B:
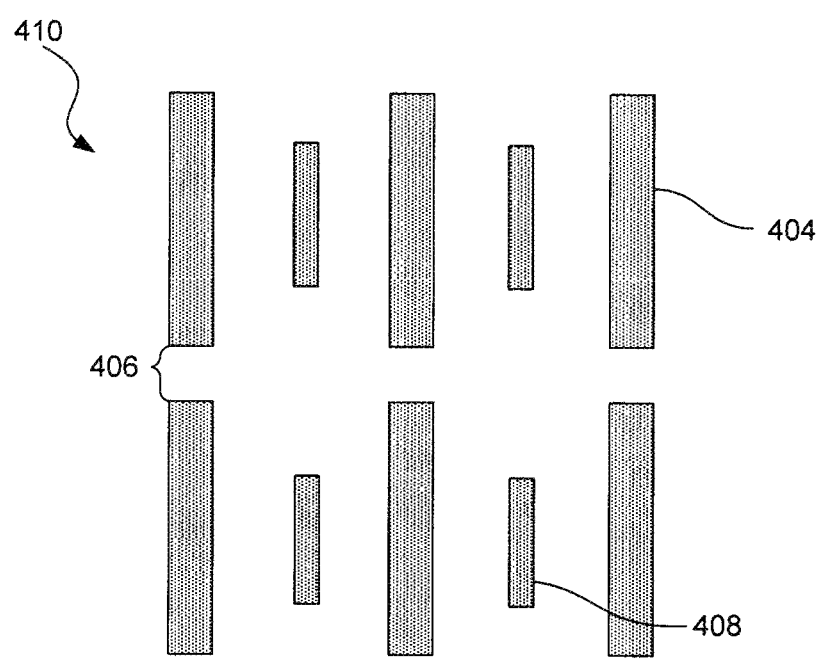

FIGS. 4A and 4B are diagrams showing illustrative test patterns 400, 410 that are used for monitoring focus. Test patterns 400, 410 may correspond to test patterns 106, 108 of FIG. 1. According to the present example, FIG. 4A illustrates a test pattern 400 that includes a series of lines 402. The lines 402 may have a particular thickness and pitch to create the desired Bossung curve.

According to the present example, FIG. 4B illustrates a test pattern 410 that has a series of lines 404. The lines may be shorter in length compared to the lines 402 of test pattern 400. The lines 404 may also have periodic gaps 406 that separate the lines 404 longitudinally. Additionally, the test pattern 410 may include various features such as scattering bars 408. Scattering bars 408 are an optical proximity correction (OPC) technique. Other OPC techniques may be used within the test pattern 410. The test patterns 400, 410 are designed such that the difference between their respective Bossung curves is substantially linear.

Figure 5:
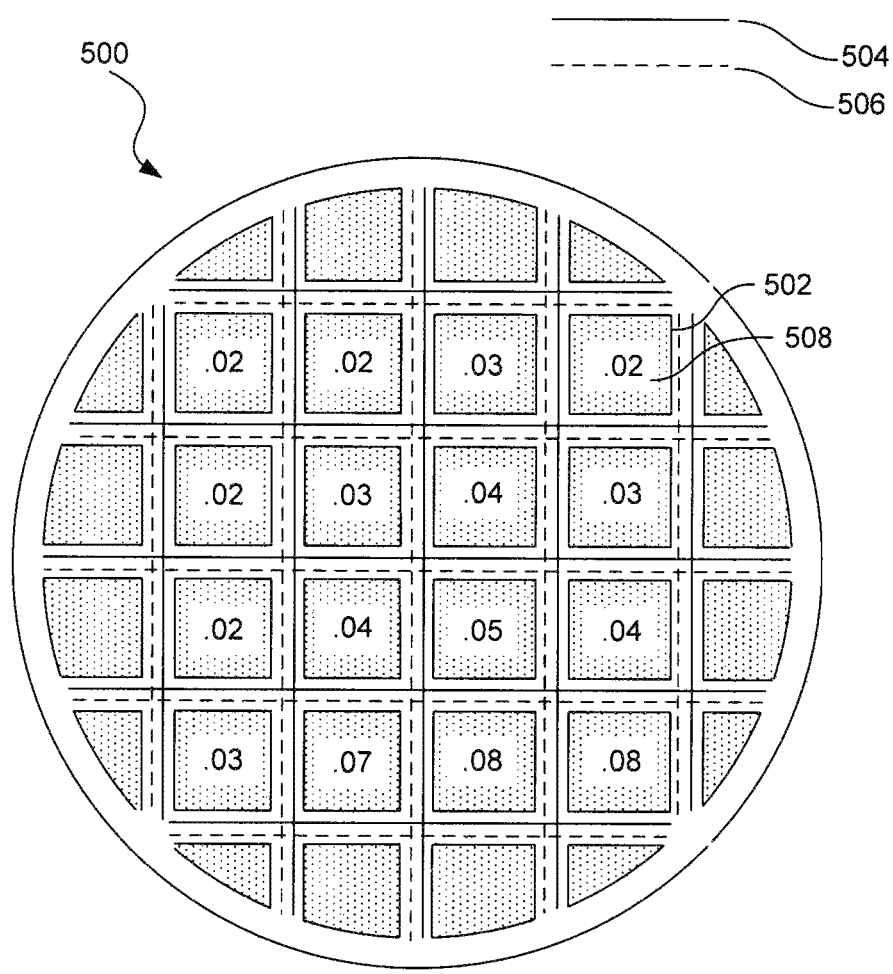
FIG. 5 is a diagram showing illustrative placement of test patterns within a production wafer, according to one example of principles described herein.

FIG. 5 is a diagram showing illustrative placement of test patterns within a production wafer. According to the present example, the test patterns 504, 506 (which may correspond to test patterns 106, 108 shown in FIG. 1) are formed along each of the scribe lines of the production wafer such that the test patterns 504, 506 surround each die. In some cases, a single photomask corresponds to a single die. The photomask may be set and scanned at the multiple die locations when processing the production wafer 500. In such a case, the test patterns 504, 506 may be formed around the perimeter of the photomask. In some examples, a photomask may include multiple dies. In such a case, the photomask may include the test patterns 504, 506 around the perimeter of the mask as well as the scribe lines between dies within the photomask.

With the test patterns 504, 506 positioned along each of the scribe lines as shown, a critical dimension difference value 508 can be determined for each die as shown. Thus, in cases where the optimal focus condition may vary slightly across the wafer, a focus value that minimizes the difference between that value and the optimal values for each die may be used. In the present example, the critical dimension values range from 0.2 and 0.8. Thus, if a critical dimension value of 0.5 is used for the whole production wafer 500, then the difference between that value and any other critical dimension value is 0.3. Thus, using the relationship as described above, the focus value may be shifted based on a critical dimension difference value of 0.5.

Figure 6:
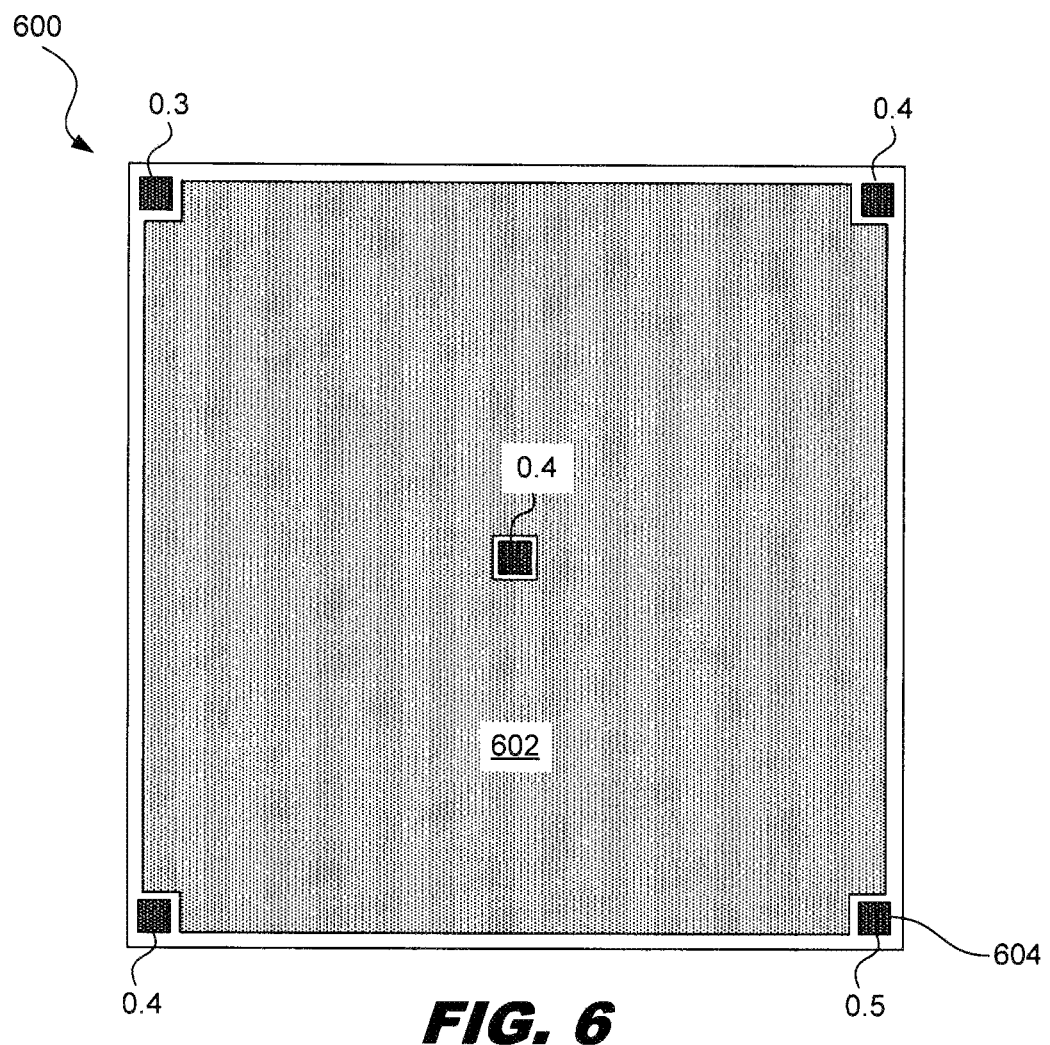
FIG. 6 is a diagram showing illustrative placement of test patterns within a single die of a production wafer, according to one example of principles described herein.

FIG. 6 is a diagram showing illustrative placement of test patterns within a single die of a production wafer. In some examples, more precise focus monitoring may be desired. Particularly, intra-die focus monitoring may be desired. In such a case, pairs of test patterns 604 may be placed at various locations throughout a single die. In some cases, this may involve sacrificing some space 602 used for production patterns. The pairs of test patterns 604 may correspond to test patterns 106, 108 described above.

With the pairs of test patterns 604 positioned throughout a single die as shown, a critical dimension difference value can be determined for different portions of the die. Thus, in cases where the optimal focus condition may vary slightly across the die, a focus value that minimizes the difference between that value and the optimal values for each location within the die may be used. In the present example, the critical dimension values range from 0.3 and 0.5. Thus, if a critical dimension value of 0.4 is used for the whole production wafer, assuming other dies have similar critical dimension values, then the difference between that value and any other critical dimension value is 0.1. Thus, using the relationship as described above, the focus value may be shifted based on a critical dimension difference value of 0.1.

Using principles described herein, various advantages and benefits may be realized. For example, production wafers may be processed without the use of an FEM wafer or FEM run, which allows for less downtime. For example, by using a predetermined set of focus conditions, and then monitoring the focus, the first production wafer run is only reworked if the critical dimension is outside a predefined tolerance. Additionally, highly sensitive inline focus monitoring can be achieved. This inline focus monitoring may provide feedback to adjust the focus conditions as needed without having, to stop production. Furthermore, more precise focus monitoring for both intra-die and inter-die focus conditions may be achieved. For example, because the test patterns can be placed at various locations throughout the production wafer, the optimal, focus conditions throughout the wafer can be determined. Thus, the focus condition for the entire wafer can be set so as to account for various portions of the wafer.

According to one example, a method includes processing a first production wafer using a first focus condition, the first production wafer comprising: a first test pattern and a second test pattern, the first test pattern and the second test pattern being different. The method further includes determining a first critical dimension for the first test pattern, determining a second critical dimension for the second test pattern, determining a delta focus value based on the first critical dimension and the second critical dimension, and processing a second production wafer with a second focus condition, the second focus condition based on the delta focus value.

According to one example, a method includes processing a first production wafer using a first focus condition, the first production wafer comprising a first test pattern and a second test pattern, the first pattern and the second pattern having substantially linear difference in their respective Bossung curves. The method further includes determining a difference between a first critical dimension for the first test pattern and a second critical dimension for the second test pattern, determining a delta focus value based on the difference, and processing a second production wafer with a second focus condition, the second focus condition based on the delta focus value.

According to one example, a production wafer includes a number of production patterns, a first test pattern formed within a test region of the production wafer, and a second test pattern formed within the test region of the production wafer, the first and second test patterns being such that a difference in their respective Bossung curves are substantially linear.

The foregoing outlines features of several embodiments so that those skilled in the art may better understand the aspects of the present disclosure. Those skilled in the art should appreciate that they may readily use the present disclosure as a basis for designing or modifying other processes and structures for carrying, out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    processing a first silicon wafer using a first focus condition, the first silicon wafer comprising:
        a first test pattern; and
        a second test pattern, the first test pattern and the second test pattern being different;
    determining a first critical dimension for the first test pattern;
    determining a second critical dimension for the second test pattern;
    determining a delta focus value based on the first critical dimension and the second critical dimension; and
    processing a second silicon wafer with a second focus condition, the second focus condition based on the delta focus value.

2. The method of claim 1, in which a polynomial representation of a Bossung curve for the first test pattern has a substantially similar first coefficient to a first coefficient of a polynomial representation of a Bossung curve for the second test pattern.

3. The method of claim 1, in which a polynomial representation of a Bossung curve for the first test pattern has a substantially different second coefficient than a second coefficient of a polynomial representation of a Bossung curve for the second test pattern.

4. The method of claim 1, in which the absolute value of A divided by B is greater than 50, wherein A is a first coefficient of a polynomial representation of a Bossung curve for the first test pattern minus a first coefficient of a polynomial representation of a Bossung curve for the second test pattern, and B is a second coefficient of the polynomial representation of the Bossung curve for the first test pattern minus a second coefficient of the polynomial representation of the Bossung curve for the second test pattern.

5. The method of claim 1, wherein a difference between a Bossung curve for the first test pattern and a Bossung curve for the second test pattern is substantially linear.

6. The method of claim 1, wherein determining the delta focus value is based on a difference between polynomial representations of Bossung curves of the first pattern and second pattern and a difference between the first critical dimension and the second critical dimension.

7. The method of claim 1, wherein the second focus condition comprises the first focus condition plus the delta focus value.

8. The method of claim 1, further comprising, reworking the first silicon wafer if a difference between the first critical dimension and the second critical dimension is above a predetermined level.

9. The method of claim 1, wherein the first test pattern comprises a set of lines and the second pattern has similar lines and scattering bars.

10. The method of claim 1, wherein the first test pattern and second test pattern are positioned within a test region of the first silicon wafer.

11. The method of claim 10, wherein the test region is along scribe lines of the first silicon wafer.

12. The method of claim 1, wherein the delta focus value is specific to a region of the first silicon wafer.

13. The method of claim 1, wherein the delta focus value is specific to a region of a die within the wafer.

14. A method comprising:
    processing a first silicon wafer using a first focus condition, the first silicon wafer comprising a first test pattern and a second test pattern, the first pattern and the second pattern having substantially linear difference in their respective Bossung curves;
    determining a difference between a first critical dimension for the first test pattern and a second critical dimension for the second test pattern;
    determining a delta focus value based on the difference; and
    processing a second silicon wafer with a second focus condition, the second focus condition based on the delta focus value.

15. The method of claim 14, further comprising, reworking the first silicon wafer if the difference between the first critical dimension and the second critical dimension is above a threshold value.

16. The method of claim 14, wherein the first test pattern and second test pattern are positioned along scribe lines of the first silicon wafer.

17. The method of claim 14, wherein the first focus condition is determined based on historical data associated with patterns to be formed on the first silicon wafer.

18. A silicon wafer comprising:
    a number of production patterns;
    a first test pattern formed within a test region of the silicon wafer; and
    a second test pattern formed within the test region of the silicon wafer, the first and second test patterns being such that a difference in their respective Bossung curves are substantially linear, wherein a polynomial representation of the difference is such that an absolute value of a second coefficient of the polynomial representation divided by a first coefficient of the polynomial representation is greater than 50.

19. The silicon wafer of claim 18, wherein the test region is along scribe lines of the silicon wafer.

20. The silicon wafer of claim 18, wherein the test region is at designated location within a die of the silicon wafer.

* * * * *